United States Patent
MS et al.

(10) Patent No.: US 12,345,789 B2
(45) Date of Patent: Jul. 1, 2025

(54) METHOD FOR UPDATING A MAGNETIC FIELD MAP DURING A MRI EXAMINATION

(71) Applicant: KONINKLIJKE PHILIPS N.V., Eindhoven (NL)

(72) Inventors: Vidya MS, Bangalore (IN); Umesh Suryanarayana Rudrapatna, Bangalore (IN); Vijayananda Jagannatha, Bangalore (IN); Ashvin Srinivasan, Bengaluru (IN); Jaladhar Neelavalli, Bengaluru (IN); Sharun S Thazhackal, Bangalore (IN); Suja Saraswathy, Bangalore (IN)

(73) Assignee: Koninklijke Philips N.V., Eindhoven (NL)

( * ) Notice: Subject to any disclaimer, the term of this patent is extended or adjusted under 35 U.S.C. 154(b) by 181 days.

(21) Appl. No.: 18/270,250

(22) PCT Filed: Dec. 29, 2021

(86) PCT No.: PCT/EP2021/087755
§ 371 (c)(1),
(2) Date: Jun. 29, 2023

(87) PCT Pub. No.: WO2022/148697
PCT Pub. Date: Jul. 14, 2022

(65) Prior Publication Data
US 2024/0118360 A1    Apr. 11, 2024

(30) Foreign Application Priority Data
Jan. 8, 2021    (EP) ...................................... 21150639

(51) Int. Cl.
*G01R 33/565* (2006.01)
*G01R 33/3875* (2006.01)

(52) U.S. Cl.
CPC ... *G01R 33/56509* (2013.01); *G01R 33/3875* (2013.01)

(58) Field of Classification Search
CPC ...................... G01R 33/3875; G01R 33/56509
See application file for complete search history.

(56) References Cited

U.S. PATENT DOCUMENTS

| | | | |
|---|---|---|---|
| 6,707,455 B2 * | 3/2004 | van Oort | A61N 2/00 345/440 |
| 10,512,418 B2 * | 12/2019 | Abe | H01F 6/06 |

(Continued)

FOREIGN PATENT DOCUMENTS

WO    2021254861 A1    12/2021

OTHER PUBLICATIONS

Boegle et al "Combining Prospective Motion Correction and Distortion Correction for EPI: Towards a Comprehensive Correction of Motion and Susceptibility Induced Artifacts" Magn. Reson. Mater Phy. vol. 23 p. 263-273 (2010).

(Continued)

*Primary Examiner* — Gregory H Curran

(57) ABSTRACT

Proposed concepts thus aim to provide schemes, solutions, concept, designs, methods and systems pertaining to updating a magnetic field ($B_0$) map of a subject during a magnetic resonance imaging (MRI) examination or during image reconstruction. In particular, when a subject moves, the magnetic field inside the magnetic bore changes. As a result, any $B_0$ map obtained prior to the movement of the subject may be inaccurate. Accordingly, an initial $B_0$ map is updated to reflect changes in the $B_0$ map caused by the movement of the subject. This can be achieved by determining a $B_0$ map of the subject based on a $B_0$ prediction model, instead of spending additional scanning time to acquire another $B_0$ map.

13 Claims, 7 Drawing Sheets

(56) References Cited

U.S. PATENT DOCUMENTS

| | | | |
|---|---|---|---|
| 10,852,381 B2* | 12/2020 | Katscher | ............ G06T 7/70 |
| 2013/0102879 A1 | 4/2013 | MacLaren et al. | |
| 2017/0293004 A1 | 10/2017 | Ladebeck et al. | |
| 2019/0064302 A1 | 2/2019 | Feiweier et al. | |
| 2020/0041600 A1 | 2/2020 | Nitta et al. | |

OTHER PUBLICATIONS

International Search Report and Written Opinion from PCT/EP2021/087755 mailed Apr. 21, 2022.

Van Gelderen et al "Real-Time Shimming to Compensate for Respiration-Induced B0 Fluctuations" Magnetic Reson. in Med. vol. 57, No. 2, Jan. 26, 2007.

So-Hee Lee et al: "High-resolution numerical simulation of respiration-induced dynamic B0 shift in the head in high-field MRI",Proceedings of the International Society for Magnetic Resonance in Medicine, 27th Annual Meeting and Exhibition, Montreal, QC, Canada, May 11-16, 2019, vol. 27, 1472, Apr. 26, 2019 (Apr. 26, 2019).

Kieran O'Brien et al: "3-D Residual Eddy Current Field Characterisation: Applied to Diffusion Weighted Magnetic Resonance Imaging", IEEE Transactions on Medical Imaging, IEEE Service Center, Piscataway, NJ, US, vol. 32, No. 8, May 6, 2013 (May 6, 2013), pp. 1515-1525.

Zhou et al: "B0 field estimation using Ultrashort echo time/Dixon imaging with a 4-class tissue segmentation", Proceedings of the International Society for Magnetic Resonance in Medicine, 28th Annual Meeting and Exhibition, Aug. 8-14, 2020, vol. 28, 671, Jul. 24, 2020.

Jezzard, Peter, and Robert S. Balaban. "Correction for geometric distortion in echo planar images from B0 field variations." Magnetic resonance in medicine 34.1 (1995): 65-73.

Yarach, Uten, et al. "Correction of B 0-induced geometric distortion variations in prospective motion correction for 7T MRI." Magnetic Resonance Materials in Physics, Biology and Medicine 29.3 (2016): 319-332.

Sulikowska, Aleksandra, et al. "Will field shifts due to head rotation compromise motion correction." Proc. 22nd Scientific Meeting of ISMRM. 2014.

Lange et al. "Estimating susceptibility induced field changes directly from diffusion MRI images and overcoming associated computational bottlenecks through GPU parallelization", ISMRM (2018).

* cited by examiner

METHOD FOR UPDATING A MAGNETIC FIELD MAP DURING A MRI EXAMINATION

CROSS REFERENCE TO RELATED APPLICATIONS

This application is a U.S. national phase application of International Application No. PCT/EP2021/087755 filed on Dec. 29, 2021, which claims the benefit of EP Application Serial No. 21150639.9 filed on Jan. 8, 2021 and is incorporated herein by reference.

FIELD OF THE INVENTION

This invention relates to the field of Magnetic Resonance Imaging (MRI), and particularly to updating a magnetic field map during an MRI examination or reconstruction.

BACKGROUND OF THE INVENTION

Magnetic resonant imaging (MRI) reconstruction assumes spatial homogeneity of the magnetic field ($B_0$). This condition is seldom satisfied, and thus leads to reduced image quality and artefacts. In particular, during an MRI scan, magnetic susceptibility variations within a subject lead to $B_0$ inhomogeneities. Therefore, producing high quality magnetic resonance images relies on correcting these $B_0$ inhomogeneities. As a result, it is typical to spend a significant amount of scanning time before the actual MRI scan in order to obtain a $B_0$ map. This $B_0$ map may be used to compensate for the $B_0$ inhomogeneities, for example, by shimming, or compensating for $B_0$ inhomogeneities during reconstruction.

However, further problems arise if the subject moves between the $B_0$ map acquisition and the actual MRI scan. This movement may cause a change in the $B_0$ map, leading to degradation of image quality. For example, when a subject's head moves within the magnetic bore of the MRI scanner, the magnetic susceptibility field will also move. Hence, the magnetic field changes, and so the $B_0$ map needs to be updated for the new head position. Unfortunately, it is impractical to perform a $B_0$ preparatory scan before the acquisition of each volume.

To a first approximation, the magnetic susceptibility field will follow the subject during rigid movement. However, for larger movements this estimate is poor, especially around axes non-parallel to the magnetic field. This necessitates a method for the modelling of $B_0$ changes with respect to motion. Existing methods focus upon the effect of isolated rotation along a single axes, and are also limited in terms of the number of positions considered and the generalizability across subjects.

SUMMARY OF THE INVENTION

The invention is defined by the claims.

According to examples in accordance with an aspect of the invention, there is provided a method for updating a magnetic field ($B_0$) map during a magnetic resonance imaging (MRI) examination of a subject or during MRI reconstruction.

The method comprises: obtaining an initial $B_0$ map of the subject associated with the start of the MRI examination; obtaining motion data of the subject during the MRI examination; and determining a motion-updated $B_0$ map of the subject based on a $B_0$ prediction model, the initial $B_0$ map of the subject, and the motion data. The $B_0$ prediction model is configured to model changes in a $B_0$ map as a function (linear or nonlinear) of motion parameters of the subject. Further, changes in the $B_0$ map are approximated by a set of spherical harmonic coefficients.

Proposed concepts thus aim to provide schemes, solutions, concept, designs, methods and systems pertaining to updating a $B_0$ map of a subject during an MRI examination or reconstruction. In particular, embodiments aim to update the $B_0$ map to reflect changes in the the $B_0$ map caused by movement (rigid and non-rigid) of the subject during an MRI examination. This can be achieved by determining a $B_0$ map of the subject based on a $B_0$ prediction model, instead of spending additional scanning time to acquire another $B_0$ map.

In other words, when the subject moves, the magnetic field inside the magnetic bore also moves. As a result, any $B_0$ map obtained prior to the movement of the subject may be inaccurate. The current invention solves this problem by determining a motion-updated $B_0$ map. This is obtained by using a $B_0$ prediction method alongside an obtained initial $B_0$ map of the subject, and motion data captured during the MRI examination. The motion-updated $B_0$ map may accurately represent the magnetic field present in the magnetic bore of the MRI machine subsequent to subject movement. As a result, methods of mitigating magnetic field inhomogeneities using a $B_0$ map may be more effective. Ultimately, high quality magnetic resonance images of the subject, with fewer artefacts, may be obtained.

Moreover, changes in the $B_0$ map due to movement of the subject may be modelled, and are not restricted to rotation around a single axis. The inventors have realized that the changes in the $B_0$ map may be obtained by modelling this movement as a linear or nonlinear function of rotational motion of the subject. Further, by approximating this motion as a set of spherical harmonic coefficients, a simplified but accurate model of the changes in the $B_0$ map may be obtained.

In some embodiments, the changes in a $B_0$ map comprise global changes generic across different subjects (for a given anatomy), and local changes specific to each subject. In this case, determining the motion-updated $B_0$ map comprises: determining the global changes to the initial $B_0$ map of the subject based on the spherical harmonic coefficients which are lower order, and the motion data; and determining the local changes to the initial $B_0$ map of the subject based on the spherical harmonic coefficients which are higher order, and the motion data.

In this way, the prediction of changes in the $B_0$ map is split into two levels—local changes and global changes. This means that the parameters which cannot be generalized across structures (local changes) are separated from those which can be generalized (global changes). As a result, the model may be trained and exploited separately. Predicted changes may then be combined to create a final prediction.

In some embodiments, the spherical harmonic coefficients are determined based on a training algorithm configured to receive an array of training inputs. The training inputs comprise $B_0$ maps of a plurality of different subjects at a plurality of different positions, and motion parameters corresponding to the $B_0$ maps.

In other words, $B_0$ maps acquired from a plurality of subjects at different motion states may be used to obtain the spherical harmonic coefficients using a training algorithm.

In some embodiments, the training inputs further comprise synthetic $B_0$ maps generated by a motion framework, and the motion parameters corresponding to the synthetic $B_0$ maps.

Further to $B_0$ maps acquired from a plurality of subjects at different orientations, synthetic $B_0$ maps may be generated and used to obtain the spherical harmonic coefficients. $B_0$ maps acquired from different subjects may be liable to measurement errors due to equipment limitations, especially at high fields. In contrast, synthetic $B_0$ maps can be more accurate and robust. Therefore, using synthetic $B_0$ maps to determine spherical harmonic coefficients may lead to more accurate spherical harmonic coefficients. The usage of synthetic $B_0$ maps allows for generation of infinite data with a large variation across subject motion states and structures, hence benefiting the learning process further.

In some embodiments, generating synthetic $B_0$ maps comprises: obtaining a structural image of a base subject; generating motion simulated structural images based on the structural image and a set of motion parameters, the motion parameters including rotations, stretches and skews; and generating synthetic $B_0$ maps based on inputting the motion simulated structural images into an analytical $B_0$ computation method.

In some embodiments, generating the motion simulated structural images comprises: obtaining a point cloud of the structural image; generating the initial mesh from the point cloud; identifying structural regions of the mesh including rigidly moving, non-rigidly moving, and fixed regions; generating a set of moved meshes from the initial mesh based on the identified structural regions and the set of motion parameters; and generating the motion simulated structural image based on the initial mesh and the moved mesh.

In some embodiments, generating one of the set of moved meshes from the initial mesh comprises: obtaining a first part of the moved mesh by transforming the rigidly moving region based on one of the set of motion parameters; obtaining a second part of the moved mesh by keeping the fixed region constant; and obtaining a third part of the moved mesh by transforming the non-rigidly moving region such that the moved mesh is a smoothly varying surface mesh.

In some embodiments, the structural image is a computed tomography (CT) image or an MRI image of the base subject.

In some embodiments, the training algorithm is a curve fitting model or a neural network.

In other words, the training algorithm used to obtain the spherical harmonic coefficients may be either a curve fitting model or a neural network.

In some embodiments, obtaining the initial B0 map comprises: acquiring the initial $B_0$ map from a $B_0$ preparatory scan performed at the start of the examination; or predicting the initial $B_0$ map from a survey scan.

In some embodiments, determining the motion-updated $B_0$ map of the subject is further based on an initial MRI image obtained at the start of the examination.

By additionally using an initial MRI image, a more accurate motion-updated $B_0$ map may be determined.

In some embodiments, the method further comprises applying an updated shim coil current to a shim coil of an MRI scanner used during the MRI examination. In this case, the updated shim coil current is configured to correct a magnetic field inhomogeneity of the MRI scanner based on the motion-updated $B_0$ map.

Accordingly, the magnetic field inside the magnetic bore of the MRI machine may be homogenised by using the motion-updated $B_0$ map. Magnetic resonance images acquired after the adjustment of the shim coil may be of higher quality, and have fewer artefacts.

In some embodiments, the method further comprises reconstructing an MRI image of the subject acquired during the MRI examination retrospectively, based on the motion-updated $B_0$ map.

This method may be used as either an alternative, or in addition, to the adjustment of the shim coil.

According to examples in accordance with an aspect of the invention, there is provided a computer program comprising code means for implementing the method of any preceding claim when said program is run on a processing system.

These and other aspects of the invention will be apparent from and elucidated with reference to the embodiment(s) described hereinafter.

BRIEF DESCRIPTION OF THE DRAWINGS

For a better understanding of the invention, and to show more clearly how it may be carried into effect, reference will now be made, by way of example only, to the accompanying drawings, in which.

DETAILED DESCRIPTION OF THE EMBODIMENTS

Figure 1A:
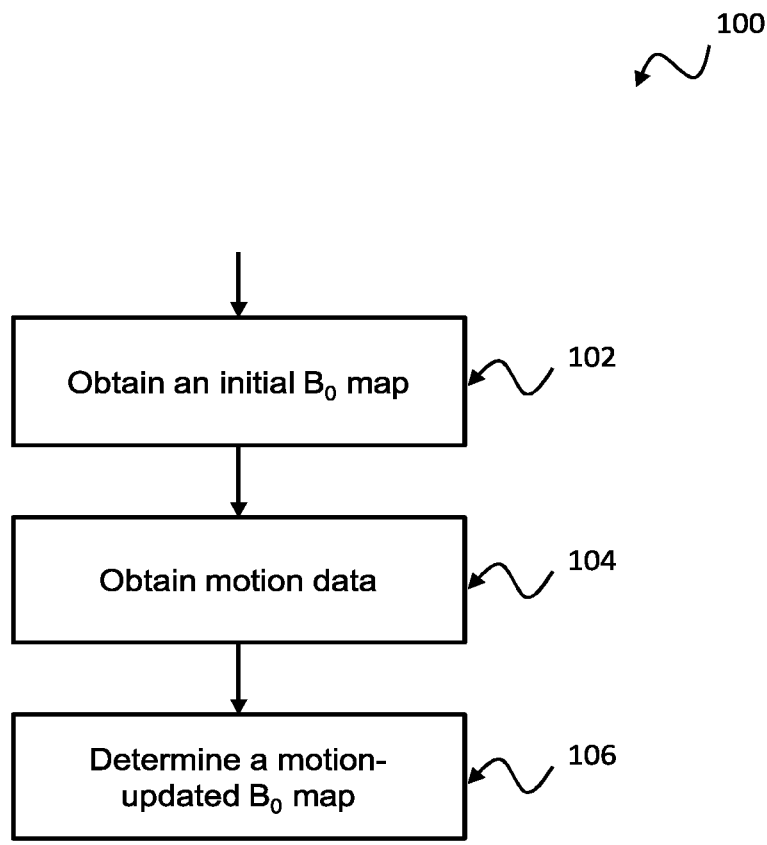
FIG. 1A is a flow diagram of an exemplary embodiment of a method for updating a $B_0$ map during an MRI examination of a subject.

The invention will be described with reference to the Figures.

It should be understood that the detailed description and specific examples, while indicating exemplary embodiments of the apparatus, systems and methods, are intended for purposes of illustration only and are not intended to limit the scope of the invention. These and other features, aspects, and advantages of the apparatus, systems and methods of the present invention will become better understood from the following description, appended claims, and accompanying drawings. It should be understood that the Figures are merely schematic and are not drawn to scale. It should also be understood that the same reference numerals are used throughout the Figures to indicate the same or similar parts.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality.

It should be understood that the Figures are merely schematic and are not drawn to scale. It should also be understood that the same reference numerals are used throughout the Figures to indicate the same or similar parts.

Implementations in accordance with the present disclosure relate to various techniques, methods, schemes and/or solutions pertaining to. According to proposed concepts, a number of possible solutions may be implemented separately or jointly. That is, although these possible solutions may be described below separately, two or more of these possible solutions may be implemented in one combination or another.

Embodiments of the invention aim to update a $B_0$ map in order to reflect changes in the $B_0$ map caused by movement of the subject during an MRI examination. This can be achieved by determining a $B_0$ map of the subject based on a $B_0$ prediction model, instead of spending additional scanning time to acquire another $B_0$ map.

Overall, embodiments may provide the following key advantages over existing methods:

(i) Reduction of scanning time. By avoiding acquisition of multiple $B_0$ maps in a scan session, scanning time may be reduced. By using only a single $B_0$ map acquired at the start of a session, and predicting $B_0$ map changes due to motion, it is possible to obtain a an up-to-date $B_0$ map of the whole session. Hence, this improves the efficiency of the scans in terms of time.

(ii) Improvement in the quality of acquired MRI images. Correcting for unaccounted motion of the subject through the scan may improve the eventually acquired MRI scans of the subject. Typically, $B_0$ map scans are not always performed before every scan, which means that movement of the subject may distort the scan. Indeed, even if a $B_0$ map is acquired before the acquisition of a volume, motion can occur during the scanning session. Hence, there may be a mismatch between the $B_0$ map and the actual magnetic field in the magnetic bore. This could all lead to artefacts in the reconstructed image.

(iii) $B_0$ map updates are robust against motion and variation in structure. Embodiments may be robust against a large range of motion parameters, such as rotations, skews and stretches. Proposed embodiments may also be robust against anatomical variations between subjects, meaning that an accurate motion-updated $B_0$ map may be acquired.

(iv) $B_0$ map updates are robust against changes due to motion involving interaction of rotation in various directions. Existing methods for $B_0$ map prediction study the effect of isolated rotation along a single axes (which are highly unlikely in practice). Embodiments of the invention take into consideration the higher order interactions between various motion parameters to account for more complex changes in the $B_0$ map due to motion. As a result, more accurate $B_0$ maps may be predicted, and in turn these may lead to an improved quality of the reconstructed MRI scan.

(v) Magnetic field correction via motion detection results in a homogenous field throughout the examination. In some embodiments, a motion sensor actively senses any motion that occurs, and a method is provided for predicting changes in the the $B_0$ map. Therefore, by employing dynamic shimming, the magnetic field may remain homogenous throughout the scanning session irrespective of motion.

(vi) $B_0$ map prediction may also be performed retrospectively, and as such may allow for iterative motion corrected reconstruction.

In some embodiments, the invention contains a $B_0$ map prediction method to determine a motion-updated $B_0$ map which is robust against anatomical variations. This motion-updated $B_0$ map is based on an initial $B_0$ map acquired at the start of the scan, and may also be based on an initial MRI image.

In an embodiment of the $B_0$ prediction method, there is provided a $B_0$ prediction model in which global (lower order) changes are predicted, which are generic across subjects. The method may also predict the local (higher order) changes which are increasingly specific to subjects.

Alternatively, in some other embodiments of the $B_0$ prediction model, there is provided a motion simulation framework. The motion simulation framework may be used to generate synthetic $B_0$ maps, which may be used for the creation of the $B_0$ prediction model using structural data.

In another embodiment of the hybrid $B_0$ prediction method, the above two methods may be used hand-in-hand for an improved prediction method.

Embodiments may also provide a system for prospective correction of subject motion. The system may actively capture motion data by monitoring the motion of the subject, and may ensure that the field is homogenous throughout the scanning session irrespective of motion. Specifically, the system according to some embodiments may contain:

(i) A motion sensor that actively monitors the subject and identifies when subject motion has occurred in order to trigger a motion estimation.

(ii) A motion estimator that identifies motion, and estimates motion quality including whether magnetic field correction is needed.

(iii) A $B_0$ map updater configured to predict and update the $B_0$ map given motion, positional and structural parameters.

(iv) A $B_0$ map scanner to determine when field correction is required, but either motion cannot be estimated, or a change in the $B_0$ map cannot be predicted.

(v) A shim coil controller configured to determine a shim coil current required from either the actual $B_0$ map, or predicted $B_0$ map/The shim coil controller triggers shimming if the MRI scanner allows for it at that given time.

(vi) A component that triggers an alert to the user if a large motion has occurred during a scan in the examination.

In a further embodiment, the $B_0$ map prediction method is used for a retrospective correction of motion in an iterative reconstruction framework. $B_0$ map changes are iteratively estimated and corrected until convergence.

Referring now to FIG. 1A, there is depicted a flow diagram of an exemplary embodiment of a method 100 for updating a $B_0$ map during an MRI examination of a subject.

In step 102, an initial $B_0$ map of the subject is obtained. The initial $B_0$ map is associated with the start of the MRI examination. The initial $B_0$ map of the subject may be obtained at the start of the examination. Alternatively, the initial $B_0$ map may be obtained prior to the examination, or during the examination.

Obtaining the initial $B_0$ map may involve acquiring the initial $B_0$ map from a preparatory scan performed at the start of the examination. This involves scanning the subject, and constructing a $B_0$ map using known methods. Alternatively, obtaining the initial $B_0$ map may involve predicting the initial $B_0$ map from an initial image, such as a survey scan. Predicting the $B_0$ map from a survey scan may mean that overall scanning time is reduced, as there is no need for an additional preparatory scan.

In step 104, motion data of the subject during the MRI examination is obtained. Motion data may include a rotation, skew, translation and/or stretch of the whole of the subject. Motion data may instead include a rotation, skew, translation and/or stretch or only a region of interest of the subject, such as the head. The motion data may be obtained by a motion sensor, which monitors the subject in the magnetic bore of the MRI machine. The motion sensor may identify when subject motion has occurred, and move onto step 106 responsive to determining that subject motion has occurred. The motion sensor may also capture a set of motion parameters responsive to determining that subject motion has occurred. The motion data may be captured by a system installed in the MRI machine such as VitalEye, or another appropriate technology.

In step 106, a motion-updated $B_0$ map of the subject is determined. The motion-updated $B_0$ map is based on a $B_0$ prediction model, the initial $B_0$ map of the subject, and the motion data. The determination of the motion-updated $B_0$ map may further be based on an initial MRI image. The initial MRI image may include an MRI magnitude image and/or an MRI phase image.

The provision of an accurate $B_0$ map is an essential element in reconstructing a high quality magnetic resonant image of a subject. However, movement of the subject inside the magnetic bore leads to changes in the magnetic field inside the bore, leading to an inaccurate $B_0$ map. This may be particularly problematic when the subject is young or old. To add to this issue, performing additional scans to determine an updated $B_0$ map can take up a significant amount of scanning time, and often cannot be performed during the scanning of a volume of a subject. The invention overcomes these issues by determining the motion-updated $B_0$ map, which records the magnetic field inside the magnetic bore of the MRI machine after movement of the subject. Due to the fact that the motion-updated $B_0$ map is determined based on the $B_0$ prediction model, there may be no need to perform additional scans to determine a $B_0$ map responsive to the movement of the subject. The $B_0$ prediction model will be described in more detail below in reference to FIG. 2.

Figure 5:
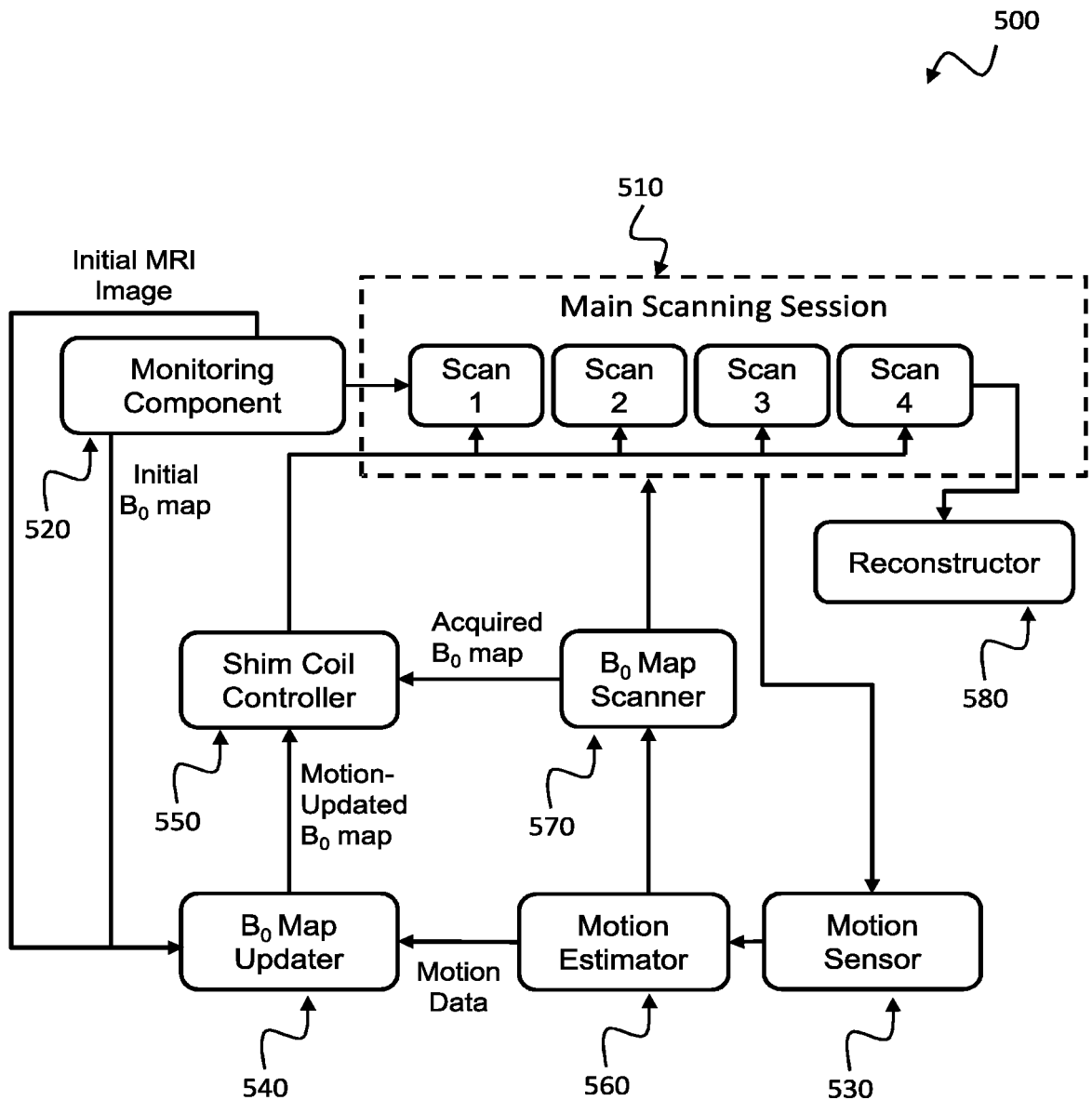
FIG. 5 is a simplified block diagram of a system for prospective $B_0$ change estimation and motion correction.

Finally, the motion-updated $B_0$ map may be used to perform shimming, as is described in more detail in reference to FIG. 5. In addition, the motion-updated $B_0$ map may be used retrospectively to reconstruct a magnetic resonance image of the subject, as is described in more detail in reference to FIG. 6. Ultimately, a magnetic resonance image of the subject may be obtained using the motion-updated $B_0$ map which may have fewer artefacts than if the initial $B_0$ map were to be used.

Figure 1B:
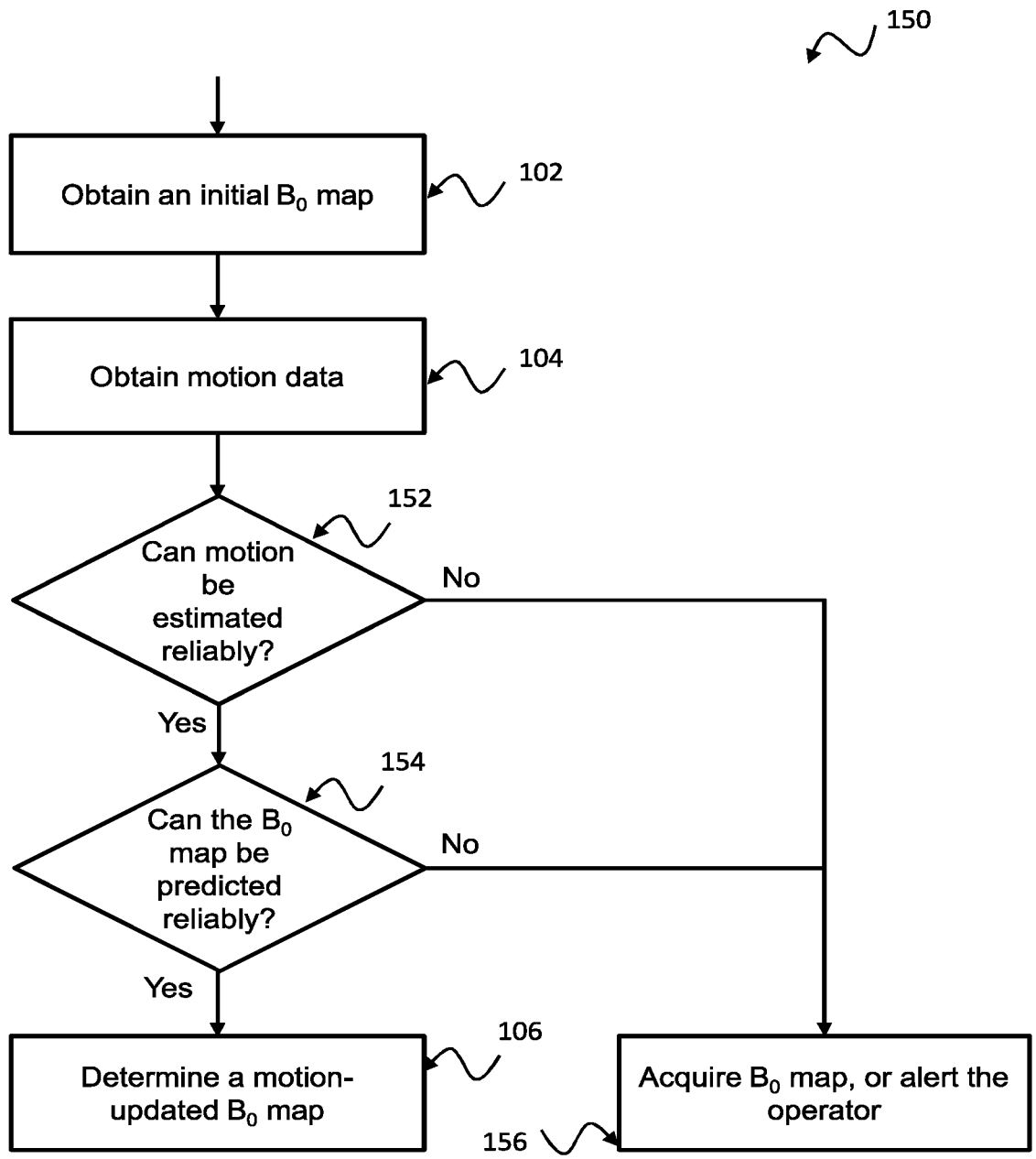
FIG. 1B is a flow diagram of another exemplary embodiment of a method for updating a $B_0$ map, including a method to acquire a $B_0$ map directly or notify an operator.

An alternative exemplary embodiment of a method 150 for updating a $B_0$ map during an MRI examination of a subject is shown in FIG. 1B.

Steps 102, 104 and 106 may be the same, or substantially the same, as those described above in reference to FIG. 1A. In addition, steps 152, 154 and 156 are included.

In this embodiment, after obtaining motion data of the subject in step 104, the method moves on to step 152. In step 152, it is determined whether the motion of the subject can be estimated reliably. In other words, the accuracy of the motion data is assessed. The accuracy of motion data may be assessed by monitoring the co-registration quality. If it is determined that the motion can be estimated reliably, then the method moves onto step 154. If it is determined that the motion cannot be estimated reliably, then the method moves onto step 156.

In step 154, it is determined whether the $B_0$ map can be predicted reliably. This determination may be based on the obtained motion data. For example, if the motion predicted from the motion data exceeds a predetermined maximum threshold, then it may be determined that a $B_0$ map cannot be determined reliably. If it is determined that the $B_0$ map can be estimated reliably, then the method moves onto step 106. If it is determined that the $B_0$ map cannot be estimated reliably, then the method moves onto step 156.

In step 156, responsive to the determination that subject motion, or a $B_0$ map cannot be determined accurately, a $B_0$ map is acquired. The $B_0$ map may be acquired when feasible, such as between scans. If it is not feasible to acquire a $B_0$ map then an operator of the MRI machine may be notified. The notification may include an alert regarding excessive motion of the subject.

In this way, the method 150 provides a means by which an accurate $B_0$ map is always available despite the possibility of inaccurate motion data, or a circumstance by which a motion-updated $B_0$ map may not be accurately determined.

Figure 2:
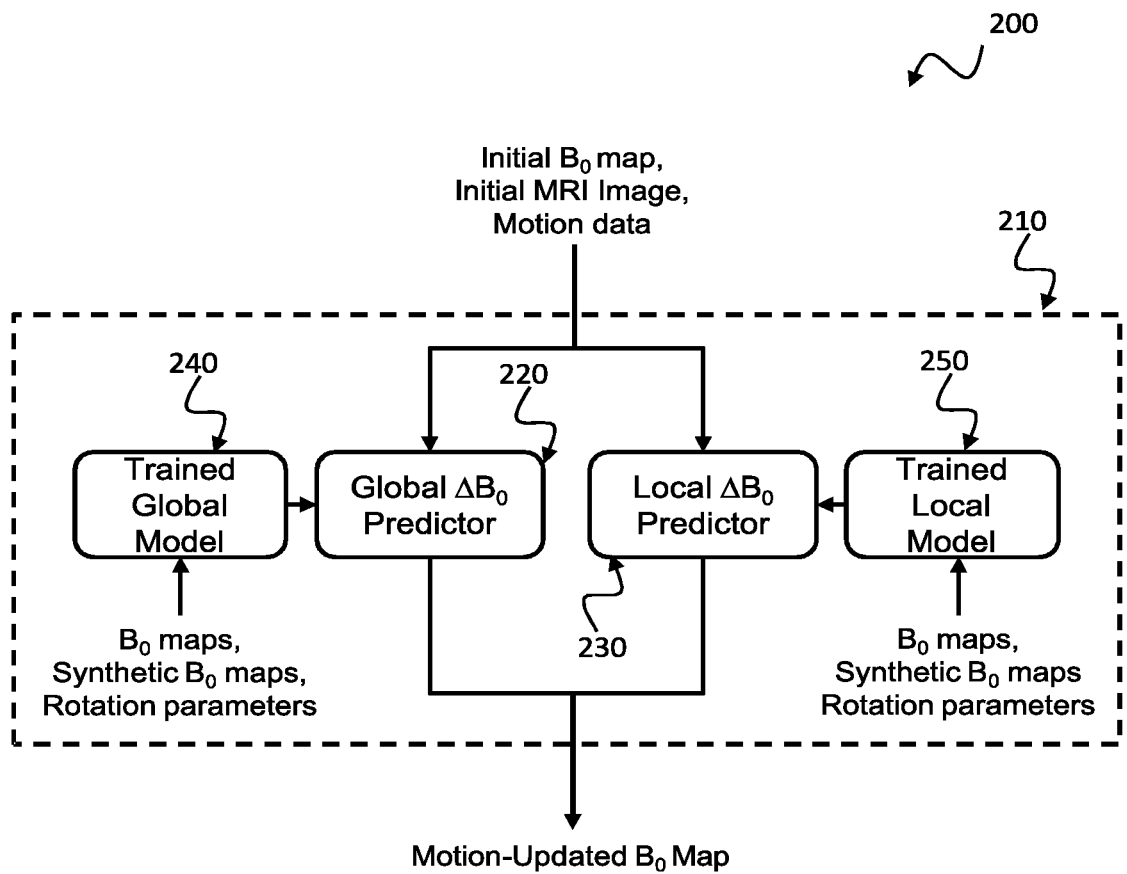
FIG. 2 is a simplified block diagram of a $B_0$ prediction model used to determine a motion-updated $B_0$ map.

A simplified block diagram 200 of a $B_0$ prediction model used to determine a motion-updated $B_0$ map is depicted in FIG. 2. The initial $B_0$ map and motion data are input to the $B_0$ prediction model 210, which determines the motion-updated $B_0$ map. In addition, an initial MRI image may be input to the $B_0$ prediction model 210.

The $B_0$ prediction model 210 may be configured to model changes in a $B_0$ map as a fit of motion parameters of the subject. The fit may be linear or non-linear. As a result, with the input of an initial $B_0$ map, and motion data of the subject, the $B_0$ prediction model 210 may model changes in the initial $B_0$ map due to motion of the subject. For example, changes in the initial $B_0$ map may be modelled by the following equation (I):

$$B_0 = a + b^* rot_x + c^* rot_y + d^* rot_z \qquad (I)$$

Further to this, changes in the $B_0$ map input to the $B_0$ prediction model 210 may be approximated by a set of spherical harmonic coefficients.

The $B_0$ prediction module 210 may separate the identification of changes in the initial $B_0$ map into global changes and local changes. Namely, changes generic across different subjects are global changes. Subject-specific changes are local changes. In this case, the $B_0$ prediction module 210 determines global changes and local changes separately. Specifically, determining the motion-updated $B_0$ map may include determining global changes to the initial $B_0$ map based on the spherical harmonic coefficients which are lower order, and the motion data. Additionally, it may include determining local changes to the initial $B_0$ map based on the spherical harmonic coefficients which are higher order, and the motion data.

A global $\Delta B_0$ predictor 220 may predict the global changes in the initial $B_0$ map due to motion of the subject by obtaining the initial $B_0$ map, motion data of the subject, and inputting this data to a trained global model 240. Additionally, the global $\Delta B_0$ predictor 220 may use an initial MRI image with the trained global model 240. The trained global model 240 may determine global changes to the initial $B_0$ map using spherical harmonic coefficients which are lower order.

A local $\Delta B_0$ predictor 230 may predict the local changes in the initial $B_0$ map due to motion of the subject by obtaining the initial $B_0$ map, motion data of the subject, and inputting this data to a trained local model 250. Additionally, the local $\Delta B_0$ predictor 230 may may use an initial MRI image with the trained local model 250. The trained local model 250 may determine local changes to the initial $B_0$ map using spherical hormonic coefficients which are higher order.

The predicted local changes and the predicted global changes may then be combined to obtain the motion-updated $B_0$ map.

The spherical harmonic coefficients may be determined based on a training algorithm configured to receive an array of training inputs, wherein the training inputs comprise $B_0$ maps of a plurality of different subjects at a plurality of different positions (or motion states), and motion parameters corresponding to the $B_0$ maps.

In other words, the training algorithm receives an array of $B_0$ maps and associated motion parameters. The updated $B_0$ maps are then approximated as a set of spherical harmonic coefficients by the training algorithm.

In the same way, the spherical harmonic coefficients of the trained local model 250 and the trained global model 230 may be determined based on a training algorithm configured to receive an array of training inputs, wherein the training inputs comprise $B_0$ maps of a plurality of different subjects at a plurality of different positions (or motion states).

In addition, the training inputs may further comprise synthetic $B_0$ maps generated by a motion framework, and the motion parameters corresponding to the synthetic $B_0$ maps. $B_0$ maps of a plurality of different subjects at a plurality of different positions (or motion states) may take a large amount of scanning time to acquire. In contrast, synthetic $B_0$ maps may be acquired from a motion framework without requiring any scanning time. In addition, acquired $B_0$ maps may have a number of artefacts or inconsistencies due to hardware imperfections, or otherwise. The generation of synthetic $B_0$ maps is described in more detail below, in reference to FIGS. 3 and 4.

As a result, by using the spherical harmonic coefficients, the initial $B_0$ map, and the motion data of the subject, a motion-updated $B_0$ map may be obtained.

The training algorithm may be a known curve fitting model. Alternatively, the training algorithm may be any machine learning algorithm, e.g. neural network. The structure of an artificial neural network is inspired by the human brain. Neural networks are comprised of layers, each layer comprising a plurality of neurons. Each neuron comprises a mathematical operation. In particular, each neuron may comprise a different weighted combination of a single type of transformation (e.g. the same type of transformation, sigmoid etc. but with different weightings). In the process of processing input data, the mathematical operation of each neuron is performed on the input data to produce a numerical output, and the outputs of each layer in the neural network are fed into the next layer sequentially. The final layer provides the output. Embodiments of the present invention employ an ANN-based learning algorithm for learning the motion-updated spherical harmonics in order to reduce the space and time complexity of the model.

To paraphrase the above, in order to determine the motion-updated $B_0$ map, magnetic field inhomogeneities must be identified. These are characterized by the size and location of magnetic field shifts (from the initial $B_0$ map) with respect to movements. In order to identify these inhomogeneities, it is essential to understand how subject shape, positioning and motion impact magnetic field changes in different regions of the subject. In some embodiments, this may be understood by using per voxel polynomial coefficients, with motion parameters as inputs. The $B_0$ prediction model 210 may parametrically learn the changes in the $B_0$ map induced by motion.

There have been limited previous efforts to estimate changes in $B_0$ maps due to motion. However, known methods do not consider the lower and higher order interactions between motion parameters in each axis (which is what a typical motion would entail in practice). Further, known methods do not address the generalizability of the method across subjects due to variation in structure.

The $B_0$ prediction model 210 may take the initial MRI image, the initial $B_0$ map, and the motion data as inputs. The model may split the prediction into two levels in order to isolate the parameters that cannot be generalized across subjects. The two levels may be: a method to predict the global (lower order) changes generic across subjects; and a method to predict the local (higher order) changes increasingly specific to subjects. The model may output the motion-updated $B_0$ map, which may be approximated as a set of spherical harmonic coefficients.

For the global changes in the $B_0$ map which are generic across subjects, the training $B_0$ maps (in the harmonic space) may be reconstructed from only the lower order harmonic coefficients. The per voxel $B_0$ map estimated from each of the lower order harmonics may be modelled as a/interaction between motion in each axis. The input features may be the rotation parameters and their interactions for the given image and the output may be the predicted magnetic field for the given voxel. For example, this may be represented by the following equation (II):

$$B_0 = a + b*rot_x + c*rot_y + d*rotz + e*rot_x*rot_y \ldots + j*rot_x^2*rot_z + \quad \text{(II)}$$

The coefficients for the above equation may be learnt through either traditional curve fitting models or neural networks. The per voxel coefficient maps for each harmonic order of the $B_0$ map may then be obtained and stored as a trained global model 240.

For the local (higher order) changes in the $B_0$ map which are specific to subject structures, the training B0 maps (in the harmonic space) are reconstructed from only the higher order harmonic coefficients. The anatomically closest training B0 map is diffeomorphically co-registered with each of the training samples. Each transformation function obtained is then applied to the atlas coefficient map. Each transformed coefficient map obtained is trained along with the spherical harmonics obtained from the initial B0 map to internally obtain a transformed coefficient map specific to the subject. Subsequently, the transformed higher order B0 coefficients specific to the subject may be obtained.

For learning the global and local B0 changes, a set of computed tomography (CT) and/or magnetic resonance images along with the corresponding coefficient maps for the B0 maps may be used.

Using the initial MRI image, the 'n' most similar samples in terms of structure and position, along with their $B_0$ maps are retrieved from the trained local model 250. This may be used to determine the local changes in the initial $B_0$ map.

The predicted global & local changes in the initial $B_0$ map may then be combined to create a motion-updated $B_0$ map.

Figure 3:
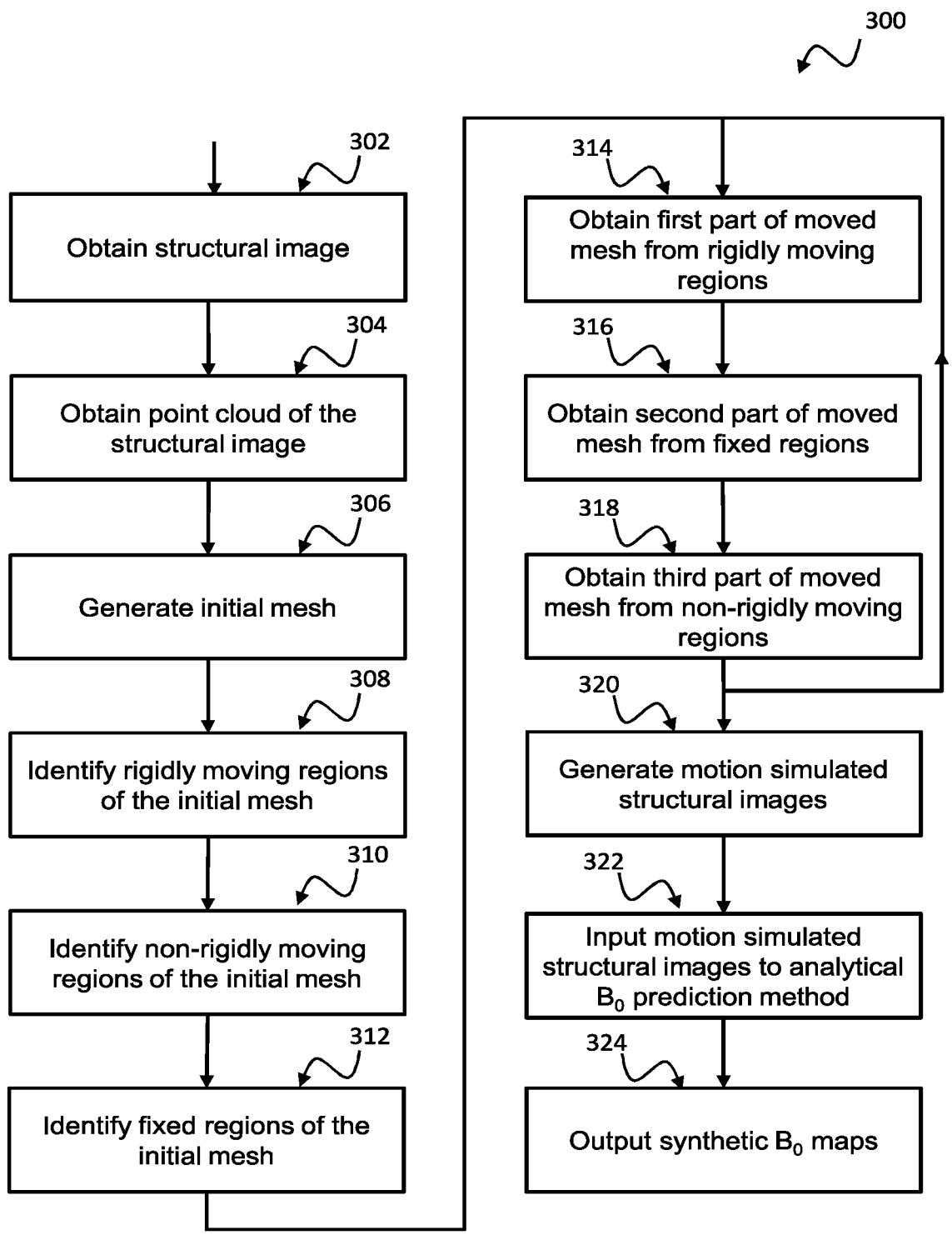
FIG. 3 is a flow diagram of a method of generating synthetic $B_0$ maps.

FIG. 3 depicts a flow diagram 300 of method of generating synthetic $B_0$ maps. This method may be used to generate $B_0$ maps of subjects at various positions. For example, this method may be used to generate samples of $B_0$ maps of heads at various positions. These may then be used to train the $B_0$ prediction model for head positions. In other words, the synthetic B0 maps are used for learning how $B_0$ maps change with motion, and ultimately may be used predict the motion-updated $B_0$ maps.

In step 302, a structural image may be obtained. The structural image may be a structural image of a base subject, and may be a structural image of part of the base subject. For example, it may be a structural image of the head of the base subject. The structural image may be a CT image, or an MRI image of the base subject. The structural image may be obtained from medical records, or it may be acquired directly from the base subject.

In steps 304 to 320, motion simulated structural images may be generated. The motion simulated structural images may be based on the obtained structural image, and a set of motion parameters. The set of motion parameters may include a set of translations, rotations, stretches, and skews, or complete deformation fields. The motion parameters may be a set of intended motion parameters, including motion of the subject which may be reasonably expected. For example, if the structure is a head, then the set of motion parameters may be a set of head rotations, but may not exceed 180° in any axis.

Specifically, in step 304 a point cloud of the structural image is obtained. The point cloud is a set of data points in space, and so may represent the 3D structural image as a set of data points. In step 306, an initial mesh may be obtained from the point cloud. The initial mesh may be determined by inputting the point cloud into many well known point cloud-mesh algorithms. The initial mesh may be, for example, a triangular mesh.

In steps 308-312, structural regions of the initial mesh may be identified. The structural regions may include rigidly moving, non-rigidly moving, and fixed regions. For example, when the initial mesh is obtained from a point cloud which represents a structural image of the head, neck and shoulders of the base subject, the head may be a rigidly moving region, the neck may be a non-rigidly moving region, and the shoulders may be a fixed region.

In steps 314-318, a moved mesh may be generated from the initial mesh. The moved mesh may be generated based on the identified structural regions, and one of the set motion parameters. The moved mesh may be generated from the initial mesh using a surface modelling method, based on one of the set of motion parameters. Indeed, by repeating steps 314-318 for each motion parameter in the set of motion parameters, a set of moved meshes may be obtained.

Specifically, in step 314, a first part of the moved mesh may be obtained by transforming the rigidly moving region of the initial mesh to a new position based on one of the set motion parameters. For example, if the motion parameter is a rotation of 15° around an x axis, then the first part of the moved mesh may be the rigidly moving region of the initial mesh rotated by 15° in x axis.

In step 316, a second part of the moved mesh may be obtained by keeping the fixed region of the initial mesh constant. As the fixed region is not affected by the motion of the subject (due to it being fixed), there may be no need to transform the initial mesh in any way.

In step 318, a third part of the moved mesh may be obtained by transforming the non-rigidly moving region of the initial mesh such that the moved mesh is a smoothly varying surface mesh.

In step 320, motion simulated structural images may be generated. The motion simulated structural images may be based on the initial mesh and the moved meshes.

In step 322, the motion simulated structural images may be input to an analytical $B_0$ computation method. For example, the analytical $B_0$ computation method may determine a susceptibility map from each motion simulated structural image. Then, based on the susceptibility map, a computed $B_0$ map may be determined using known methods.

In step 324, synthetic $B_0$ maps generated by the analytical $B_0$ computation method, based on the motion simulated structural images, may be output.

Figure 4:
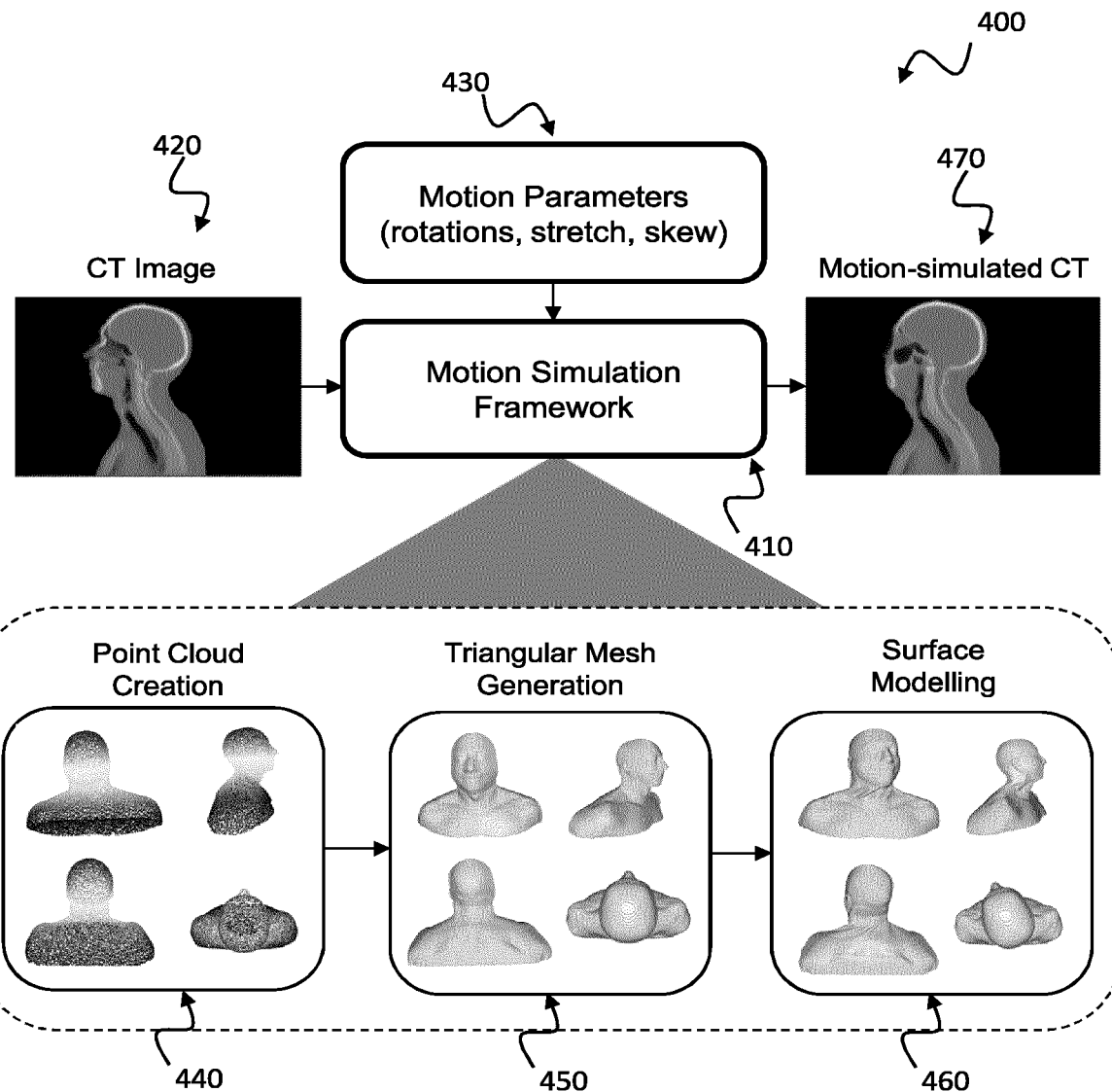
FIG. 4 is a diagram representing the inputs, outputs and function of a motion simulation framework.

By way of further example, FIG. 4 presents a diagram 400 representing a method of using a motion simulation framework 410;

A structural image 420, such as a CT image, may be leveraged to generate synthetic $B_0$ maps at various positions. The synthetic $B_0$ maps may represent the head of various subjects at various positons. It is noted that synthetic $B_0$ maps may not only simulate data at different positions, but may also simulate different patients, i.e. induce anatomical variability through stretch and skew. The synthetic $B_0$ map may be used for the learning how $B_0$ maps change. Overall, the synthetic $B_0$ maps may be used to predict the updated field maps to be used by the scanner for setting shim currents during scan and/or retrospective correction of MRI images.

In an exemplary embodiment of the motion simulation framework 410, the motion simulation framework may perform the following steps:
 (i) A structural image 420 (CT or MRI) may be provided along with a set of motion parameters 430 (including rotations, stretches, and skews) as an input to the motion simulation framework 410.
 (ii) The motion simulation framework 410 then creates a point cloud 440, and subsequently creates an initial mesh 450 from the structural image 420. The initial mesh may be a triangular mesh.
 (iii) The mesh 450 is then divided into rigidly moving, non-rigidly moving, and fixed regions. In some examples, this may be the head, neck and shoulders respectively.
 (iv) Using a surface modelling method 460 and the identified regions, the mesh of the rigidly moving region is transformed based on motion parameters to a new position.
 (v) The fixed region is kept constant.
 (vi) The non-rigidly moving region is allowed to transform to an optimal condition leading to a smoothly varying surface mesh.
 (vii) Using the initial mesh and the new mesh, a motion simulated structural image 470 is generated.
 (viii) Using the motion simulated structural image 470, and an analytical $B_0$ computation method, a synthetic $B_0$ map may be generated.

Moving onto FIG. 5, there is depicted a simplified block diagram 500 of a system for prospective $B_0$ map change estimation and motion correction. Specifically, the system detects movement of the subject in the bore, determines a motion-updated $B_0$ map, and updates the shim coil current of the MRI accordingly.

The method of updating the $B_0$ map during an MRI examination of a subject detailed in reference to FIGS. 1-4 may further comprise applying an updated shim coil current to a shim coil of an MRI scanner used during the MRI examination. The updated shim coil current in this case may be configured to correct a magnetic field inhomogeneity of the MRI scanner based on the motion-updated $B_0$ map. The system 500 depicted in FIG. 5 may determine the motion-updated $B_0$ map, and set a shim coil current of the MRI scanner accordingly.

The system 500 may control an MRI scanner in order to reduce magnetic field inhomogeneities due to motion of a subject during the main scanning session 510. The system includes a monitoring component 520 configured to obtain an initial $B_0$ map and an initial MRI image before the scan. The system 500 may further include a motion sensor 530 configured to obtain motion data of the subject during the scan, and a $B_0$ map updater 540 configured to determine a motion-updated $B_0$ map based on the initial magnetic field map, the initial MRI image, and the motion data. The system 500 may also include a shim coil controller 550 configured to control an operating parameter of a shim coil of the MRI scanner based on the motion-updated $B_0$ map.

Thus, when an MRI image of a subject is obtained from the system 500, there may be fewer artefacts as an operating parameter of the shim coil may be adjusted for the movement of the subject. This is because an adjusted shim coil may reduce the presence of magnetic field inhomogeneities, if the $B_0$ map on which it is based is accurate. Typical systems assume that the $B_0$ map is temporally static, which is an assumption that breaks down over long scans. This is particularly the case when the subject is, for example, a child. So, by having a motion sensor 530 which continually monitors the subject, and a $B_0$ map updater 540 which can generate a motion-updated $B_0$ map to be used in shimming, the shim coil can be adjusted to negate magnetic field inhomogeneities.

In addition, the system 500 may include a motion estimator 560 configured to determine an accuracy of the motion data acquired from the motion sensor 530. The motion estimator 560 may be further configured to control a $B_0$ map scanner 570 to acquire a $B_0$ map based on the determined accuracy being below a certain predetermined threshold accuracy. As a result, even when the motion sensor 530 does not capture accurate motion data, a motion-updated $B_0$ map may be obtained which may be used for the shim coil controller 550 to perform shimming. When the accuracy of the motion data is adequate, then it may not be necessary to acquire a $B_0$ map from the $B_0$ map scanner 570 as the $B_0$ map updater 540 may determine one instead, leading to a reduced scanning time.

Further, the motion estimator 560 may also be configured to determine a feasibility of predicting the motion-updated $B_0$ map based on the motion data. In this case, the motion estimator 560 may be further configured to control a $B_0$ map scanner 570 to acquire a $B_0$ map based on the determined feasibility being below a certain predetermined threshold feasibility.

In other words, the motion estimator 560 may also assess the accuracy of the motion data by monitoring the co-registration quality. If the co-registration is of acceptable quality the motion estimator 560 may trigger the $B_0$ map updater 540. If the co-registration is not of acceptable quality then a $B_0$ map scanner 570 may be triggered to directly acquire a $B_0$ map. Similarly, the motion estimator 560 may also automatically determine whether or not the prediction of a motion-updated $B_0$ map is feasible given the motion data. If it is not feasible then the $B_0$ map scanner 570 may be triggered to directly acquire a $B_0$ map. In all cases, the system retrieves a $B_0$ map (predicted or scanned) reflecting the latest system state, which is used for updating the shim currents and performing shimming. In this case, the efficacy of the motion estimation may also be measured. With this information, the system allows for triggering of a $B_0$ map scan in case the prediction confidence is low, ensuring that the $B_0$ map estimation is accurate in cases where motion cannot be estimated accurately.

The motion sensor 560 may be further configured to determine whether the subject has moved, and obtain the motion data responsive to determining that the subject has moved. In this way, unnecessary updating of the $B_0$ map may be avoided.

The operating parameter of the shim coil may be a shim coil current. In this case, the shim coil controller 550 may be configured to apply an updated shim coil current to the shim coil, where the updated shim coil current is configured to correct magnetic field inhomogeneities in the magnetic bore based on the motion updated $B_0$ map.

In another embodiment, the motion sensor 530 may be further configured to determine whether a large movement has occurred based on the motion data. If a large movement is detected, then an alert may be communicated to a user. The user may be a professional operating the MRI machine, or may be the subject inside the magnetic bore. This may provide warnings to the user, so that movement may be reduced.

To summarise, the monitoring component 520 may be configured to perform an initial survey scan, and to obtain the initial $B_0$ map and initial MRI image. The system may then perform a main scanning session 510. The main scanning session 510 may not contain any additional $B_0$ map scans. All through the scanning session, the motion sensor 530 monitors the subject in the bore. The motion sensor 530 may be any motion sensor capable of tracking movement of the subject in the magnetic bore, such as VitalEye. If at any point, the motion sensor 530 detects motion, this motion sensor may trigger the motion estimator 560. The motion estimator 560 may reconstruct the intermediate image from the subsequent k-space data, calculate the registration between the intermediate image and the initial $B_0$ map scan, and compute the motion data.

The $B_0$ map updater 540 then takes the motion data, the initial $B_0$ map, and the initial MRI image to predict the change in $B_0$ map from the initial $B_0$ map. This may be performed using the method described above in relation to FIGS. 1-4. The motion-updated $B_0$ map field map may then be used by the shim coil controller 550 to compute the new shim currents, which may in turn be used for shimming.

The shim coil may allow for setting of shim fields at only the start of the scan, or at any point in the scanning session. This may be determined by a flag. The flag may be set based on the ability of the MRI scanner to update the higher order shims, and may also be based on the user requirements. If the MRI scanner is capable of updating higher order shims within each scan, the current ongoing scan may be paused until shimming is performed, and then restarted once the shim field has been updated. The user may be notified by the motion sensor of any motion that requires a re-scan to be done via an alert on the monitor.

Finally, the raw data from the main scanning session 510, along with the corresponding $B_0$ residuals obtained may be sent to a reconstructor 580 for final reconstruction of the magnetic resonance image.

Figure 6:
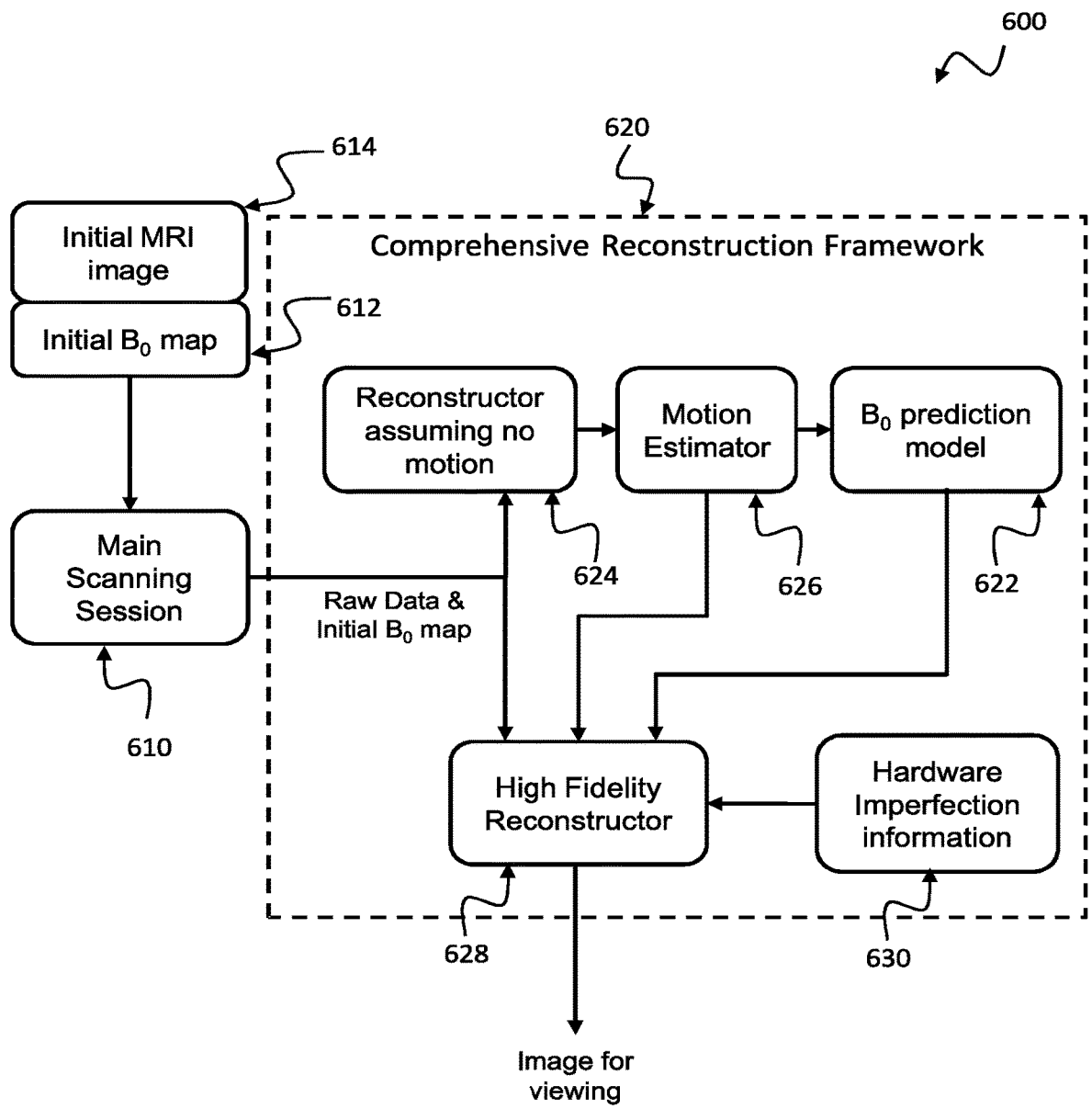
FIG. 6 is a simplified block diagram of a system for retrospective $B_0$ change estimation and motion correction.

FIG. 6 depicts a simplified block diagram of a system 600 for retrospective $B_0$ map change estimation and motion correction. Raw data of the main scanning session 610, along with an initial $B_0$ map 612, and a smart survey 614, may be provided to a comprehensive reconstruction framework, which outputs an image adequate for viewing.

A $B_0$ prediction model 622 may be used for retrospectively estimating the change in the $B_0$ map, which may be used for retrospective motion correction in a comprehensive reconstruction framework 620.

Raw data and an initial $B_0$ map from the main scanning session may be supplied to a reconstructor 624. The raw data may include k-space data, and raw motion data of the subject captured during the main scanning session 610. The reconstructor 624 may generate an MRI image assuming that the subject did not move at all during the main scanning session 610. The motion estimator 626 may then determine motion data from the raw data of the main scanning session 610. The motion data, the raw data, and the initial $B_0$ map may be used by the $B_0$ prediction model 622 to determine a motion-updated $B_0$ map. The high fidelity constructor 628 may take the initial $B_0$ map, the raw data, the motion data, hardware imperfection data from a hardware imperfection log 630, and the motion-updated $B_0$ map, and produce an image for viewing.

In some embodiments, motion data of the subject, along with an initial $B_0$ map, and an initial MRI image may input to the $B_0$ prediction model 622 to predict a motion-updated $B_0$ map. This may then be used to update predicted magnetic field inhomogeneities. A second reconstruction with the improved $B_0$ map estimates may be performed in order to refine the image quality. The motion data may be updated based on the new image, leading to further refinement of the $B_0$ map used for reconstruction. This process can be repeated for a fixed number of iterations. Alternatively, this process may be repeated until a convergence criterion is met. For example, the convergence criterion may be met when the root mean square deviation between two consecutive reconstructions falls below a threshold. While in some embodiments there may be data-driven motion estimation, in other embodiments the motion data captured during the examination may be used.

The present invention may be a method, a system, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

A single processor or other unit may fulfill the functions of several items recited in the claims.

It will be understood that the disclosed methods are computer-implemented methods. As such, there is also proposed a concept of a computer program comprising code means for implementing any described method when said program is run on a processing system.

The skilled person would be readily capable of developing a processor for carrying out any herein described method. Thus, each step of a flow chart may represent a different action performed by a processor, and may be performed by a respective module of the processing processor.

As discussed above, the system makes use of a processor to perform the data processing. The processor can be implemented in numerous ways, with software and/or hardware, to perform the various functions required. The processor typically employs one or more microprocessors that may be programmed using software (e.g. microcode) to perform the required functions. The processor may be implemented as a combination of dedicated hardware to perform some functions and one or more programmed microprocessors and associated circuitry to perform other functions.

Examples of circuitry that may be employed in various embodiments of the present disclosure include, but are not limited to, conventional microprocessors, application specific integrated circuits (ASICs), and field-programmable gate arrays (FPGAs).

In various implementations, the processor may be associated with one or more storage media such as volatile and non-volatile computer memory such as RAM, PROM, EPROM, and EEPROM. The storage media may be encoded with one or more programs that, when executed on one or more processors and/or controllers, perform the required functions. Various storage media may be fixed within a processor or controller or may be transportable, such that the one or more programs stored thereon can be loaded into a processor.

Variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. If the term "adapted to" is used in the claims or description, it is noted that the term "adapted to" is intended to be equivalent to the term "configured to". Any reference signs in the claims should not be construed as limiting the scope.

The invention claimed is:

1. A method for updating a magnetic field, $B_0$, map during a magnetic resonance imaging (MRI) examination of a subject or during reconstruction, comprising:
   obtaining an initial $B_0$ map of the subject associated with a start of the MRI examination;
   obtaining motion data of the subject during the MRI examination; and
   determining a motion-updated $B_0$ map of the subject based on a $B_0$ prediction model, the initial $B_0$ map of the subject, and the motion data, wherein the $B_0$ prediction model is configured to model changes in a $B_0$ map as a fit of motion parameters of the subject, and wherein changes in the $B_0$ map are approximated by a set of spherical harmonic coefficients wherein the changes in the $B_0$ map comprise global changes generic across different subjects, and local changes specific to each subject, and wherein determining the motion-updated $B_0$ map comprises:
   determining the global changes to the initial $B_0$ map of the subject based on the spherical harmonic coefficients which are lower order, and the motion data; and
   determining the local changes to the initial $B_0$ map of the subject based on the spherical harmonic coefficients which are higher order, and the motion data.

2. The method of claim 1, wherein the spherical harmonic coefficients are determined based on a training algorithm configured to receive an array of training inputs, wherein the training inputs comprise $B_0$ maps of a plurality of different subjects at a plurality of different positions, and motion parameters corresponding to the $B_0$ maps.

3. The method of claim 2, wherein the training inputs further comprise synthetic $B_0$ maps generated by a motion framework, and the motion parameters corresponding to the synthetic $B_0$ maps.

4. The method of claim 3, wherein generating synthetic $B_0$ maps comprises:
   obtaining a structural image of a base subject;
   generating motion simulated structural images based on the structural image and a set of motion parameters, the motion parameters including rotations, stretches and skews; and
   generating synthetic $B_0$ maps based on inputting the motion simulated structural images into an analytical $B_0$ computation method.

5. The method of claim 4, wherein generating the motion simulated structural images comprises:
   obtaining a point cloud of the structural image;
   generating an initial mesh from the point cloud;
   identifying structural regions of the initial mesh including rigidly moving, non-rigidly moving, and fixed regions;
   generating a set of moved meshes from the initial mesh based on the identified structural regions and the set of motion parameters; and
   generating the motion simulated structural images based on the initial mesh and the moved meshes.

6. The method of claim 5, wherein generating one of the set of moved meshes from the initial mesh comprises:
   obtaining a first part of the moved mesh by transforming the rigidly moving region based on one of the set of motion parameters;
   obtaining a second part of the moved mesh by keeping the fixed region constant; and
   obtaining a third part of the moved mesh by transforming the non-rigidly moving region such that the moved mesh is a smoothly varying surface mesh.

7. The method of claim 4, wherein the structural image is a computed tomography, CT, image or an MRI image of the base subject.

8. The method of claim 2, wherein the training algorithm is a curve fitting model or a neural network.

9. The method of claim 1, wherein obtaining the initial B0 map comprises:
   acquiring the initial $B_0$ map from a $B_0$ preparatory scan performed at the start of the examination;
   or predicting the initial $B_0$ map from a survey scan.

10. The method of claim 1, wherein determining the motion-updated $B_0$ map of the subject is further based on an initial MRI image obtained at the start of the examination.

11. The method of claim 1, further comprising:
    applying an updated shim coil current to a shim coil of an MRI scanner used during the MRI examination, wherein the updated shim coil current is configured to correct a magnetic field inhomogeneity of the MRI scanner based on the motion-updated $B_0$ map.

12. The method of claim 1, further comprising:
    reconstructing an MRI image of the subject acquired during the MRI examination retrospectively based on the motion-updated $B_0$ map.

13. A computer program comprising code comprising instructions stored on a non-transitory computer readable medium, such that when executed by a processor implements the method of claim 1.

* * * * *